US006639840B1

United States Patent
Rapp et al.

(10) Patent No.: US 6,639,840 B1
(45) Date of Patent: Oct. 28, 2003

(54) NON-VOLATILE LATCH CIRCUIT THAT HAS MINIMAL CONTROL CIRCUITRY

(75) Inventors: A. Karl Rapp, Los Gatos, CA (US); Hungyu H. Hou, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/037,790

(22) Filed: Jan. 3, 2002

(51) Int. Cl.$^7$ .............................................. G11C 11/34
(52) U.S. Cl. ............................ 365/185.28; 365/185.18
(58) Field of Search ....................... 365/185.28, 185.05, 365/185.18

(56) References Cited

U.S. PATENT DOCUMENTS 5,168,464 A * 12/1992 Stanchak et al. ........... 365/185
5,587,603 A   12/1996 Kowshik .................... 257/316
6,307,773 B1  10/2001 Smith ........................ 365/154

OTHER PUBLICATIONS

Betty Prince, "Semiconductor Memories", 1983, Wiley, 2$^{nd}$ edition, pp. 152–154.*

* cited by examiner

*Primary Examiner*—M. Tran
(74) *Attorney, Agent, or Firm*—Sidley Austin Brown & Wood LLP

(57) ABSTRACT

A non-volatile latch circuit that has minimal control circuitry is disclosed. The non-volatile latch circuit is typically used in applications where only several bits of data need to be stored in non-volatile memory. The non-volatile latch circuit can be programmed and read using three control signals: a programming voltage/supply voltage signal, a data in signal, and a read/write signal. By using fewer control signals, the number of transistors used to implement the control circuitry within the non-volatile latch circuit is reduced and thus the non-volatile latch circuit consumes less chip area/volume on an integrated circuit device.

32 Claims, 5 Drawing Sheets

NON-VOLATILE LATCH CIRCUIT THAT HAS MINIMAL CONTROL CIRCUITRY

BACKGROUND OF THE INVENTION

1. Field of the Invention

The present invention relates to integrated circuit devices and, more particularly, to a non-volatile latch circuit that has minimal control circuitry.

2. Related Art

Semiconductor memory can be classified as either volatile or non-volatile memory. Volatile memory loses its stored information when power is removed from the memory, whereas non-volatile memory retains its stored information when power is removed from the memory. One common type of non-volatile memory is known as a non-volatile latch circuit. A non-volatile latch circuit is capable of storing one bit of data (i.e., a logic 1 or a logic 0).

Non-volatile latch circuits can be classified as non-dedicated control circuitry or dedicated control circuitry non-volatile latch circuits. Non-dedicated control circuitry non-volatile latch circuits are used in applications where many bytes of data (e.g., thousands of bytes) need to be stored. These non-volatile latch circuits are typically arranged in a two-dimensional array and are controlled by control circuitry that is shared by each of the non-volatile latch circuits. For example, row and column decoder circuitry is shared by each of the non-volatile latch circuits in the array. An example of an integrated circuit device that uses these non-volatile latch circuits is an electrically erasable programmable read-only memory (EEPROM) chip.

Dedicated control circuitry non-volatile latch circuits are used in applications where only several bits (e.g., less than 32 bits) of data need to be stored. These non-volatile latch circuits each include their own dedicated control circuitry. A drawback with this type of latch circuit is that the dedicated control circuitry is complex and consumes a relatively large amount of chip area/volume since it requires numerous transistors to implement. For example, a conventional non-volatile latch circuit of this type may include 2 storage circuit transistors and 36 control circuit transistors. Thus the overwhelming majority of the transistors used in the non-volatile latch circuit are used for the dedicated control circuitry.

Accordingly, what is needed is a non-volatile latch circuit that has minimal control circuitry and thus consumes less chip area/volume on an integrated circuit device.

SUMMARY OF THE INVENTION

The present invention provides a non-volatile latch circuit and a corresponding method that has minimal control circuitry. The non-volatile latch circuit is typically used in applications where only several bits of data (e.g., less than 32 bits) need to be stored in non-volatile memory. The non-volatile latch circuit can be programmed and read using three control signals: a programming voltage/supply voltage signal, a data in signal, and a read/write signal. By using fewer control signals, the number of transistors within the non-volatile latch circuit is reduced and thus the non-volatile latch circuit consumes less chip area/volume on an integrated circuit device.

In one embodiment of the present invention, a non-volatile latch circuit is disclosed. The non-volatile latch circuit includes a storage circuit, and a control circuit coupled to the storage circuit, the control circuit operable to program a logic value into the storage circuit using only a programming voltage/supply voltage signal, a data input signal, and a read/write signal.

In another embodiment of the present invention, a non-volatile latch circuit is disclosed. The non-volatile latch circuit includes a storage circuit comprising a first floating gate transistor and a second floating gate transistor, and a control circuit. The control circuit includes a third transistor coupled to receive a programming voltage/supply voltage signal and a fourth transistor coupled to receive the programming voltage/supply voltage signal, a fifth transistor coupled to receive a data input signal and a first inverter coupled to receive the data input signal, and a second inverter coupled to receive a read/write signal, a sixth transistor coupled to receive the read/write signal, and a seventh transistor coupled to receive the read/write signal.

In another embodiment of the present invention, a method for programming a non-volatile latch circuit is disclosed. The method includes increasing a programming voltage/supply voltage signal from a first voltage value to a second voltage value, maintaining the programming voltage/supply voltage signal at the second voltage value while maintaining a data input signal at a constant voltage value and while maintaining a read/write signal at a constant voltage value, and decreasing the programming voltage/supply voltage signal from the second voltage value to the first voltage value.

Other embodiments, aspects, and advantages of the present invention will become apparent from the following descriptions and the accompanying drawings.

BRIEF DESCRIPTION OF THE DRAWINGS

For a more complete understanding of the present invention and for further embodiments, aspects, and advantages, reference is now made to the following description taken in conjunction with the accompanying drawings, in which.

DETAILED DESCRIPTION OF THE INVENTION

Figure 1:
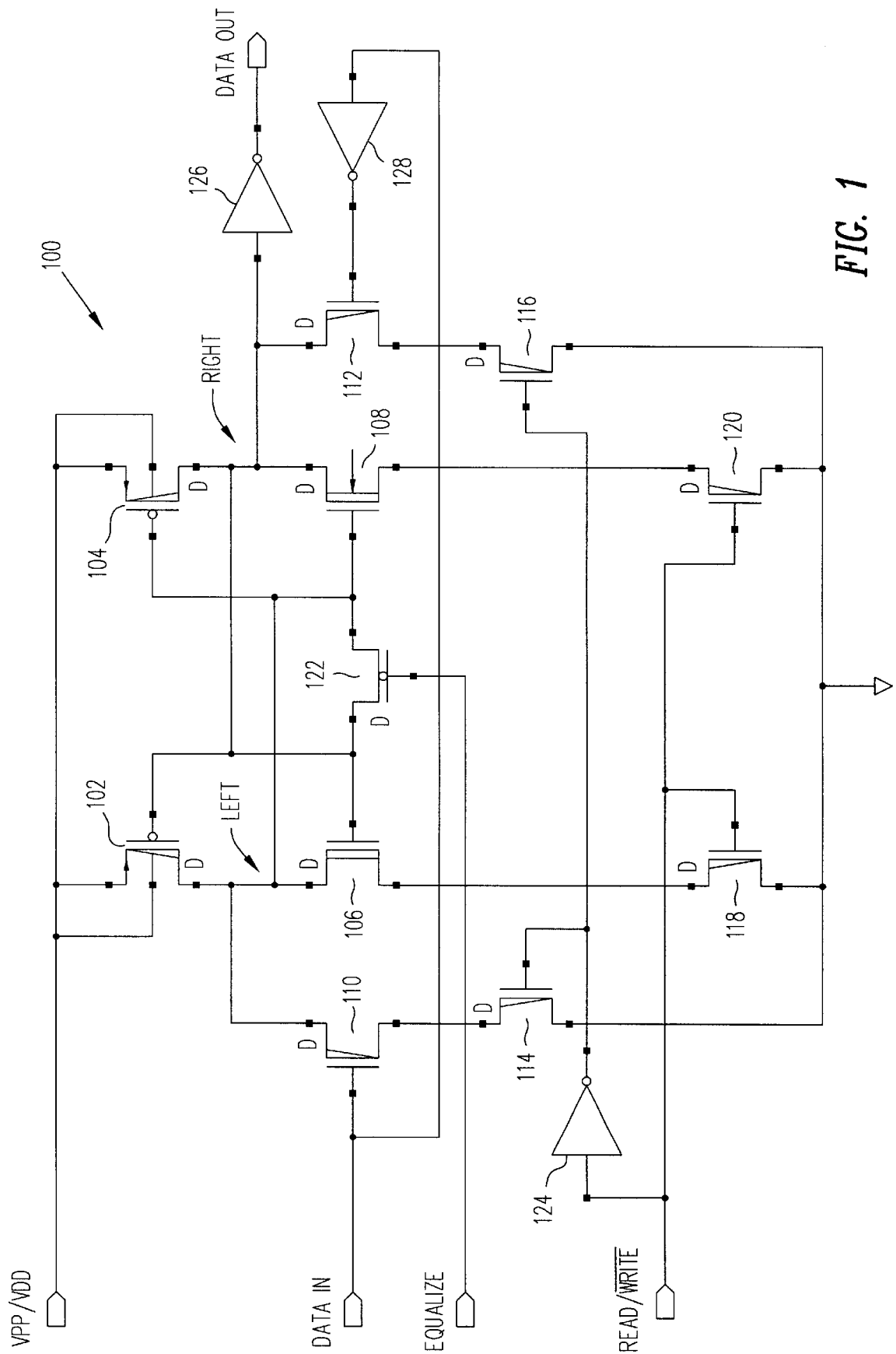
FIG. 1 is a schematic diagram of a non-volatile latch circuit that has minimal control circuitry, according to some embodiments of the present invention.

The preferred embodiments of the present invention and their advantages are best understood by referring to FIGS. 1 through 5 of the drawings. Like reference numerals are used for like and corresponding parts of the various drawings.

I. Non-volatile Latch Circuit—Example 1

A. Structure of Non-volatile Latch Circuit

FIG. 1 is a schematic diagram of a non-volatile latch circuit 100 having minimal control circuitry, according to some embodiments of the present invention. Non-volatile latch circuit 100 is capable of storing a bit of data (i.e., a logic 1 or a logic 0). Typically, several non-volatile latch circuits 100 (e.g., less than 32) will be incorporated into an integrated circuit device to provide storage for relatively few bits of data. An advantage of non-volatile latch circuit 100 is that it occupies a relatively small amount of chip area/ volume when compared to conventional non-volatile latch circuits. This is due to a reduction in the amount of control signals and control circuitry used to control non-volatile latch circuit 100. As mentioned above, some conventional non-volatile latch circuits (including their control circuitry) are implemented using 38 transistors, whereas non-volatile latch circuit 100 of the present invention (including its control circuitry) can be implemented using as few as 16 transistors. This represents a chip area/volume savings of more than 50%.

Non-volatile latch circuit 100 includes storage circuitry that includes floating gate NMOS transistors 106 and 108. Floating gate NMOS transistors 106 and 108 collectively store one bit of data (i.e., a logic 1 or a logic 0). Non-volatile latch circuit 100 also includes control circuitry that includes PMOS transistors 102 and 104, NMOS transistors 110, 112, 114, 116, 118, and 120, NMOS transistor 122, and inverters 124, 126, and 128. PMOS transistors 102 and 104, NMOS transistors 110, 112, 114, 116, 118, and 120, NMOS transistor 122, and inverters 124, 126, and 128 are used to control programming (or writing) and/or reading of the storage circuitry. Inverters 124, 126, and 128 can be standard CMOS inverters that include a PMOS transistor and a NMOS transistor. Some or all of the transistors of non-volatile latch circuit 100 can be high-voltage transistors. The manner in which the circuit elements of non-volatile latch circuit 100 are connected to one another is readily apparent from FIG. 1 and thus will not be described in detail herein.

Non-volatile latch circuit 100 receives four control signals: signal VPP/VDD, signal DATAIN, signal EQUALIZE, and signal READ/WRITE. Control signals VPP/VDD, DATAIN, EQUALIZE, and READ/WRITE are used to control the programming of and/or the reading of non-volatile latch circuit 100. Control signal VPP/VDD can be a supply voltage VDD or a programming voltage VPP. The supply voltage VDD is typically 1.8V to 5.0V. The programming voltage VPP is typically 10V to 16V. The programming voltage VPP is used during the programming operation. Control signal DATAIN carries the binary value that will be stored in non-volatile latch circuit 100 (e.g., a logic 1 or a logic 0). Control signal EQUALIZE is a signal that causes the two sides of non-volatile latch circuit 100 (i.e., LEFT node and RIGHT node) to be briefly connected at the beginning of a read operation. Control signal EQUALIZE is used to equalize any charge imbalance between the left and right side of non-volatile latch circuit 100. In some embodiments, control signal EQUALIZE and NMOS transistor 122 can be omitted (as explained in detail below).

B. Programming of Non-volatile Latch Circuit

Figure 2:
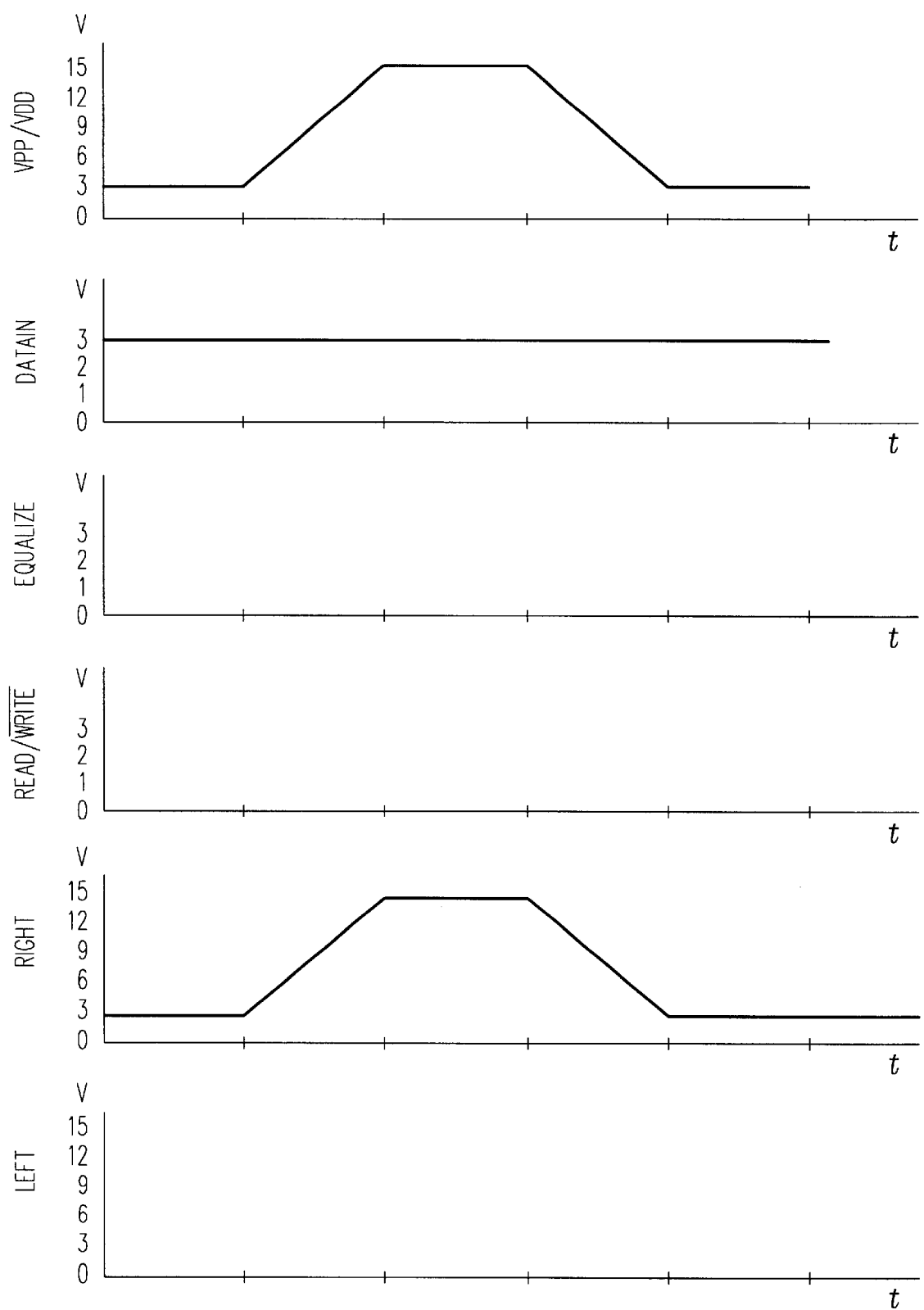
FIG. 2 shows waveforms during a programming (or writing) operation for the non-volatile latch circuit of FIG. 1.

An exemplary programming operation for non-volatile latch circuit 100 is described in this section. This example assumes that a logic 1 will be programmed into non-volatile latch circuit 100. FIG. 2 includes waveforms for control signals VPP/VDD, DATAIN, EQUALIZE, and READ/WRITE and waveforms for the signals that appear at nodes LEFT and RIGHT for this example.

In this example, the supply voltage VDD is 3V, and the programming voltage VPP increases from 3V to a maximum value of 16V. Control signal DATAIN is held at a logic high level (i.e., 3V) during the entire programming operation since a logic 1 will be written into non-volatile latch circuit 100. If a logic 0 were to be written into non-volatile latch circuit 100, control signal DATAIN would be held at a logic low level (e.g., 0V) during the entire programming operation. Control signal EQUALIZE is held at a logic low level (i.e., 0V) during the entire programming operation since control signal EQUALIZE is not used during the programming operation. Control signal READ/WRITE is held at a logic low level (i.e., 0V) during the entire programming operation indicating that a programming (or writing) operation is being performed.

During the entire programming operation, control signal DATAIN is held at a logic high level. This causes NMOS transistor 110 to be ON (i.e., conducting) and NMOS transistor 112 to be OFF (i.e., not conducting). Additionally, during the entire programming operation, control signal READ/WRITE is held at a logic low level. This causes NMOS transistors 114 and 116 to be ON and NMOS transistors 118 and 120 to be OFF. Since NMOS transistors 110 and 114 are ON, the LEFT node (which is also the drain of floating gate NMOS transistor 106) is connected to ground during the entire programming operation. Since the LEFT node is connected to ground, PMOS transistor 104 is ON and the top gate of floating gate NMOS transistor 108 is held at ground during the entire programming operation. Since PMOS transistor 104 is ON, control signal VPP/VDD appears at the RIGHT node and at the top gate of floating gate NMOS transistor 106 during the entire programming operation. Since the value of control signal VPP/VDD is logic high during the entire programming operation, PMOS transistor 102 is OFF during the entire programming operation. Thus during the entire programming operation: (1) the drain of floating gate NMOS transistor 106 is held at ground and control signal VPP/VDD appears at the top gate of floating gate NMOS transistor 106; and (2) the top gate of floating gate NMOS transistor 108 is held at ground and control signal VPP/VDD appears at the drain of floating gate NMOS transistor 108.

During the actual programming (writing) operation, the conditions established in the preceding paragraph are maintained, and the value of control signal VPP/VDD is increased from VDD (3V) to VPP (16V). The high positive electric field established between the drain of floating-gate NMOS transistor 108 and its top gate causes electrons to be stripped from the floating gate and tunnel through the underlying oxide to the drain. The consequent rising in potential of the floating gate causes the effective threshold voltage of NMOS transistor 108 to decrease. Typical threshold voltage values may be within the range of +0.5V to −1V.

Simultaneously, as the value of control signal VPP/VDD is increased from VDD (3V) to VPP (16V), a reverse-polarity electric field is established between the drain of floating gate NMOS transistor 106 and its top gate. This negative electric field attracts electrons, which tunnel up to the floating gate. The consequent decrease in potential of the floating gate causes the effective threshold voltage of NMOS transistor 106 to increase. Typical threshold voltage values may be within the range of +3V to +5V.

At the end of the programming operation, the value of control signal VPP/VDD decreases to the value of the supply voltage VDD (i.e., 3V). As those of ordinary skill in the art will recognize, once programmed, non-volatile latch circuit 100 will reliably retain its programmed state for many years (e.g., 10 years).

C. Reading of Non-volatile Latch Circuit

Two examples of a reading operation for non-volatile latch circuit 100 are described in this section. The first example assumes that the reading operation is not performed immediately (e.g., more than a few milliseconds) after non-volatile latch circuit 100 has been programmed. The second example assumes that the reading operation is performed immediately (e.g., a few or less than a few milliseconds) after non-volatile latch circuit 100 has been programmed.

In general during a reading operation, control signal READ/WRITE is asserted (i.e., raised to a logic high level) to force non-volatile latch circuit 100 to one of two states. The state that non-volatile latch circuit 100 assumes is determined by the value of the threshold voltages of floating gate NMOS transistors 106 and 108 that were programmed during the previous programming operation. Note that before control signal READ/WRITE has been asserted (i.e., raised to a logic high level), the value of signal DATAOUT does not necessarily correspond to the stored memory state.

1. Reading Not Performed Immediately After Programming

Figure 3:
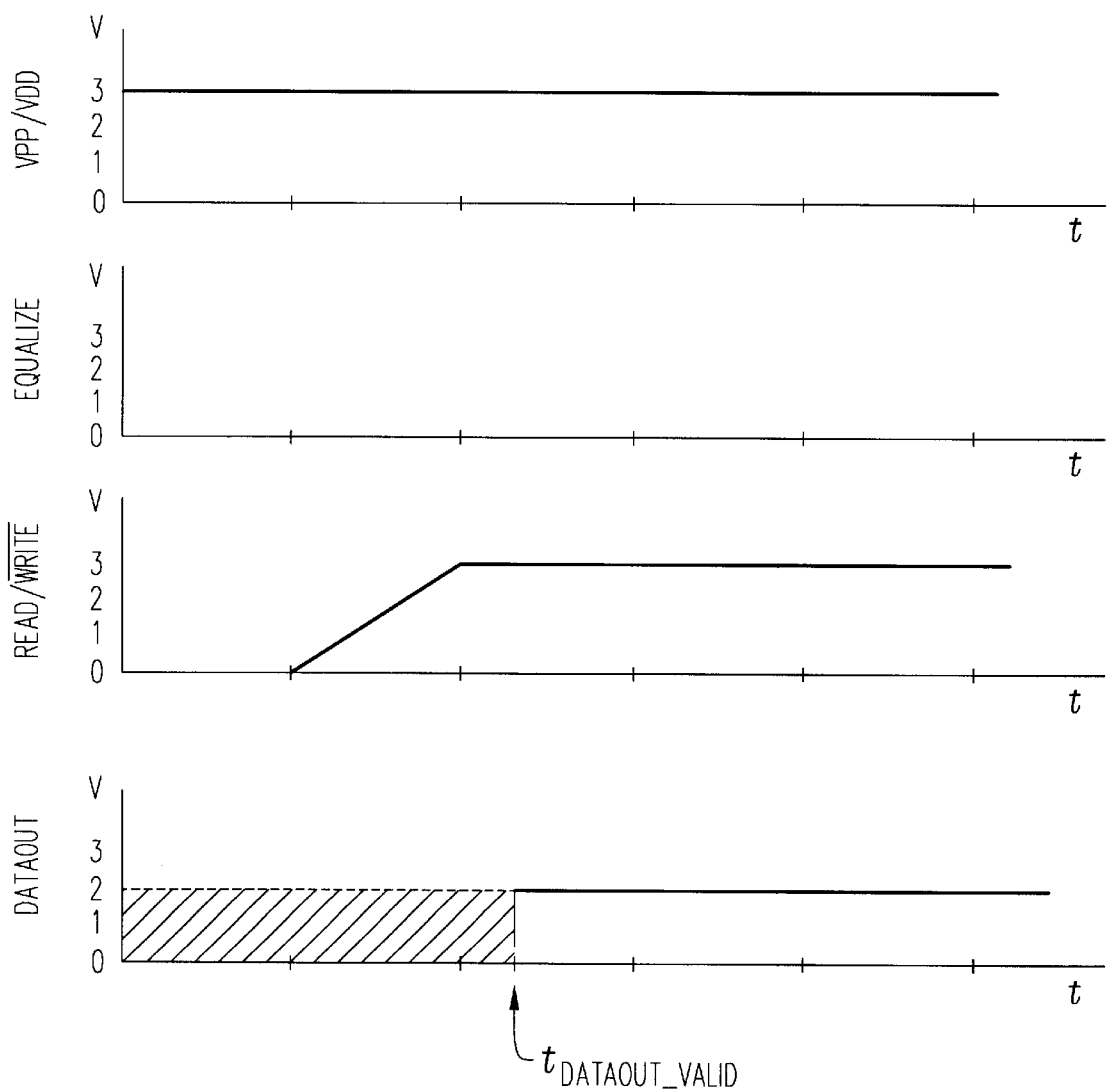
FIG. 3 shows waveforms during a reading operation that is not performed immediately after the programming operation for the non-volatile latch circuit of FIG. 1.

This first example assumes that the reading operation is not performed immediately after non-volatile latch circuit 100 has been programmed. This example also assumes that a logic 1 has been programmed into non-volatile latch circuit 100 as described in Section B. FIG. 3 shows waveforms for control signals VPP/VDD, EQUALIZE, READ/WRITE, and DATAOUT for this example.

At the beginning of this reading operation, control signal READ/WRITE is raised to a logic high level. This causes NMOS transistors 114 and 116 to be OFF and NMOS transistors 118 and 120 to be ON. Since NMOS transistors 118 and 120 are ON, the sources of floating gate NMOS transistors 106 and 108 are pulled to ground. Since floating gate NMOS transistor 108 has been driven into a low or negative threshold voltage condition during programming (i.e., since this example assumes a logic 1 was programmed into non-volatile latch circuit 100), the drain of floating gate NMOS transistor 108 is pulled to a logic low level (e.g., ground). This causes PMOS transistor 102 to turn ON. Since PMOS transistor 102 is ON, the value of the LEFT node is raised to the value of control signal VPP/VDD, which is at a logic high level. This causes PMOS transistor 104 to be OFF. At this point, the non-volatile latch circuit 100 stabilizes with the voltage value at the LEFT node being at a logic high level and the voltage value at the RIGHT node being at a logic low level. Since the voltage value at the RIGHT node is at a logic low level, the voltage value of signal DATAOUT is at a logic high level, indicating that the data bit stored in non-volatile latch circuit 100 is a logic 1. At this point, which is labeled $t_{DATAOUT\_VALID}$ in FIG. 3, signal DATAOUT is valid.

2. Reading Performed Immediately After Programming

Figure 4:
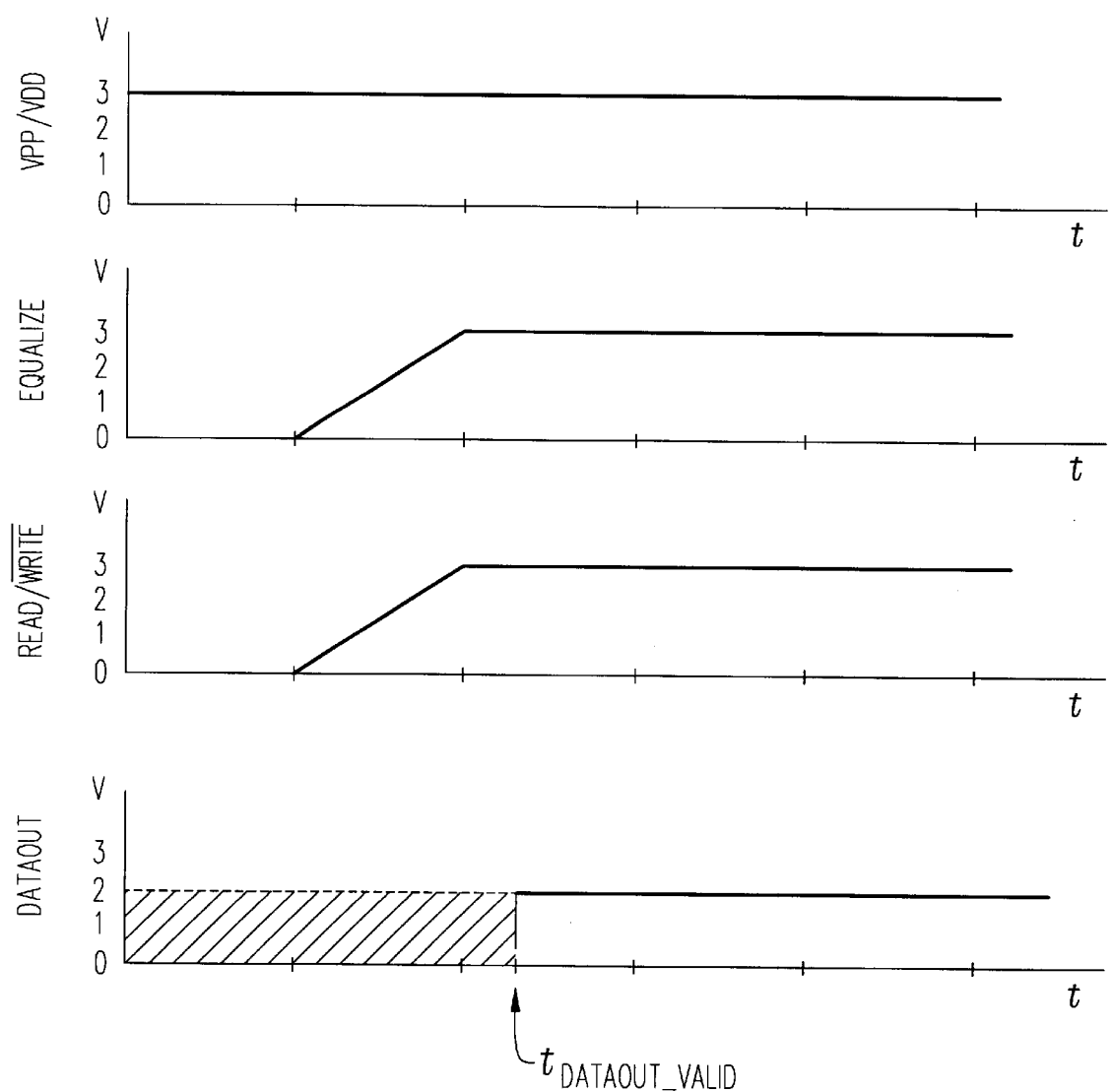
FIG. 4 shows waveforms during a reading operation that is performed immediately after the programming operation for the non-volatile latch circuit of FIG. 1.

This second example assumes that the reading operation is performed immediately after non-volatile latch circuit 100 has been programmed. This example also assumes that a logic 1 has been programmed into non-volatile latch circuit 100. FIG. 4 shows waveforms for control signals VPP/VDD, EQUALIZE, READ/WRITE, and DATAOUT for this example.

Immediately after programming, there is a difference between the residual charge on LEFT node and RIGHT node. If non-volatile latch circuit 100 were read at this time, the difference between the residual charge on LEFT node and RIGHT node could cause non-volatile latch circuit 100 to be misread. For example, if a logic 1 is programmed into non-volatile latch circuit 100, the RIGHT node would be raised to a high voltage (e.g., 16V) during programming, causing a significant amount of charge to accumulate on the RIGHT node. If non-volatile latch circuit 100 were read immediately after the programming operation (e.g., within a few milliseconds), the RIGHT node may still contain a significant amount of residual charge, causing an indeterminate latch state and signal DATAOUT to be logic low. As a result, the value of signal DATAOUT would be erroneous. To overcome this problem, control signal EQUALIZE can be used as described below.

At the beginning of this reading operation, control signal EQUALIZE is raised to a logic high level for a short period of time. This causes NMOS transistor 122 to be ON thereby connecting the LEFT and RIGHT nodes to one another. As such, the difference between the residual charge on LEFT node and RIGHT node is reduced or eliminated.

At approximately the same time (or following the equalizing operation), control signal READ/WRITE is raised to a logic high level. This causes NMOS transistors 114 and 116 to be OFF and NMOS transistors 118 and 120 to be ON. Since NMOS transistors 118 and 120 are ON, the sources of floating gate NMOS transistors 106 and 108 are pulled to ground. Since floating gate NMOS transistor 108 has been driven into a low or negative threshold voltage condition during programming (i.e., since this example assumes a logic 1 was programmed into non-volatile latch circuit 100), the drain of floating gate NMOS transistor 108 is pulled to a logic low level (e.g., ground). This causes PMOS transistor 102 to turn ON. Since PMOS transistor 102 is ON, the value of the LEFT node is raised to the value of control signal VPP/VDD, which is at a logic high level. This causes PMOS transistor 104 to be OFF. At this point, the non-volatile latch circuit 100 stabilizes with the voltage value at the LEFT node being at a logic high level and the voltage value at the RIGHT node being at a logic low level. Since the voltage value at the RIGHT node is at a logic low level, the voltage value of signal DATAOUT is at a logic high level, indicating that the data bit stored in non-volatile latch circuit 100 is a logic 1. At this point, which is labeled $t_{DATAOUT\_VALID}$ in FIG. 4, signal DATAOUT is valid.

Thus, control signal EQUALIZE can be used in any situation where non-volatile latch circuit 100 is programmed and then immediately read or any other situation where the difference between the residual charge on LEFT node and RIGHT node needs to be reduced or eliminated. An example of the former situation is during device testing. During device testing, a testing machine may program a non-volatile latch and then immediately read the non-volatile latch to see if it is operating properly. The control signal EQUALIZE can be used to ensure that there is little or no difference between the residual charge on LEFT node and RIGHT and thus ensure that the correct value is read out of the non-volatile latch circuit during the testing operation.

Note that if there is no need to read non-volatile latch circuit 100 immediately after the programming operation, non-volatile latch circuit 100 can be implemented without control signal EQUALIZE and NMOS transistor 122 because sufficient time will have elapsed to allow the residual charge on LEFT node and RIGHT node to leak off. In this case, an open circuit can replace NMOS transistor 122. If NMOS transistor 122 is omitted, non-volatile latch circuit 100 can be implemented using 16 transistors.

II. Non-volatile Latch Circuit—Example 2

A. Structure of Non-volatile Latch Circuit

Figure 5:
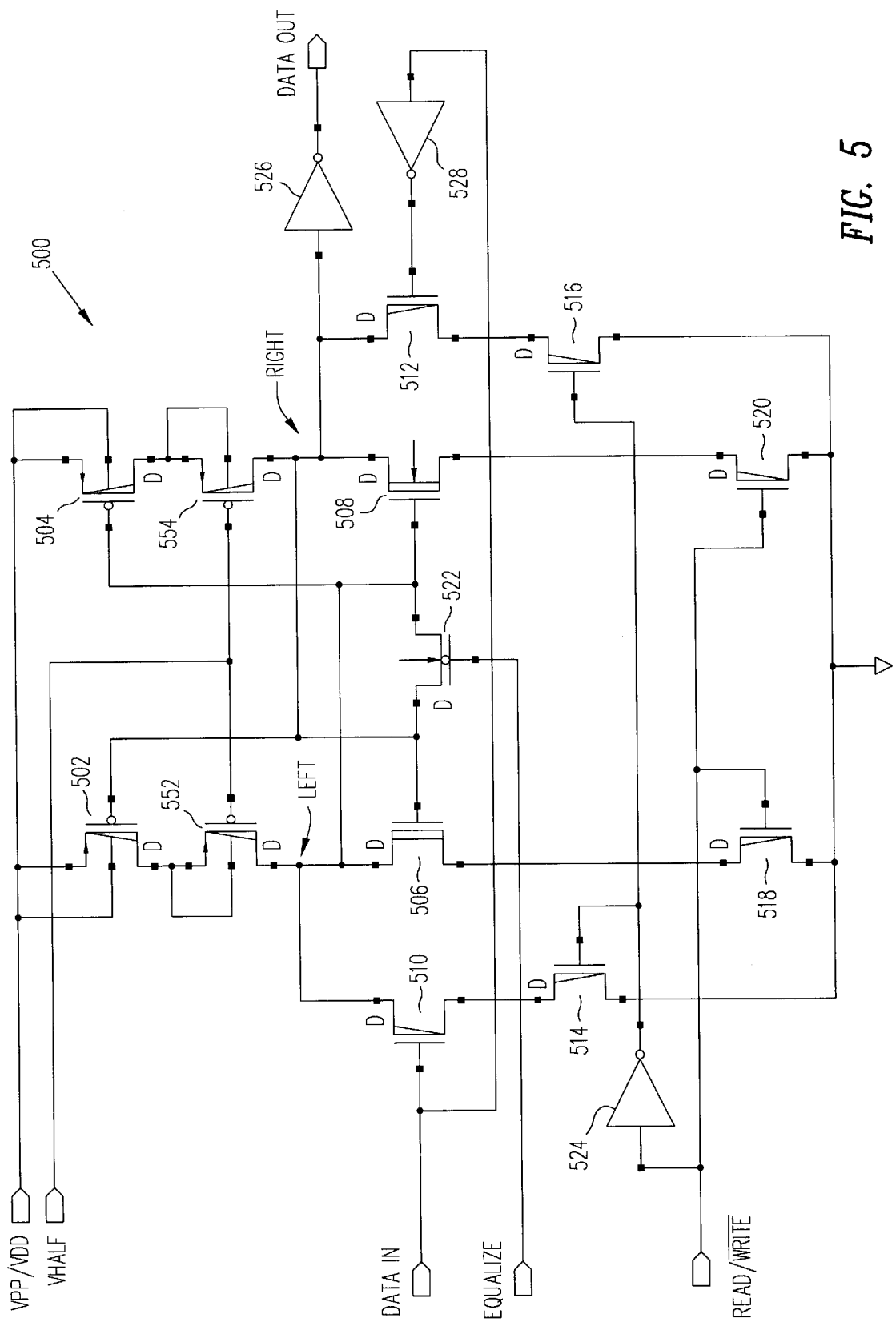
FIG. 5 is a schematic diagram of a non-volatile latch circuit that has minimal control circuitry, according to some embodiments of the present invention.

FIG. 5 is a schematic diagram of a non-volatile latch circuit 500 having minimal control circuitry, according to some embodiments of the present invention. Non-volatile latch circuit 500 is substantially identical to non-volatile latch circuit 100 except that non-volatile latch circuit 500 includes PMOS transistors 552 and 554. As explained below, PMOS transistors 552 and 554 are used to prevent the drain-to-source voltage of PMOS transistors 502 and 504 from exceeding their maximum value during programming. Some or all of the transistors of non-volatile latch circuit 500 can be high-voltage transistors. The manner in which the circuit elements of non-volatile latch circuit 500 are connected to one another is readily apparent from FIG. 5 and thus will not be described in detail herein.

B. Programming of Non-volatile Latch Circuit

If PMOS transistors 502 and 504 are fabricated using many well-known semiconductor fabrication processes, the maximum drain-to-source voltage that PMOS transistors 502 and 504 can withstand is approximately 10V. However, during programming, the programming voltage VPP typically exceeds 10V. Thus the maximum drain-to-source voltage of PMOS transistors 502 and 504 may be exceeded during programming. To overcome this problem, PMOS transistors 550 and 552 can be placed in series with PMOS transistors 502 and 504.

During programming, the voltage VHALF can be controlled such that approximately half of the programming voltage VPP appears across the drain-to-source of PMOS transistor 502 while the other half of the programming voltage VPP appears across the drain-to-source of PMOS transistor 552. And similarly, half of the programming voltage VPP appears across the drain-to-source of PMOS transistor 504 while the other half of the programming voltage VPP appears across the drain-to-source of PMOS transistor 554. This ensures that the maximum drain-to-source voltage of PMOS transistors 502 and 504 is not exceeded.

C. Reading of Non-volatile Latch Circuit

The reading operations for non-volatile latch circuit 500 are similar to those described above in connection with non-volatile latch circuit 100 (i.e., in sections IC1 and IC2). During these reading operations, the voltage VHALF is held at a logic low level (e.g., 0V) causing PMOS transistors 552 and 554 to be turned ON. As such, transistors 552 and 554 have no appreciable effect on the reading operations described in connection with non-volatile latch circuit 100.

III. Alternative Embodiments

While particular embodiments of the present invention have been shown and described, it will be apparent to those skilled in the art that changes and modifications may be made without departing from this invention in its broader aspect and, therefore, the appended claims are to encompass within their scope all such changes and modifications as fall within the true spirit of this invention.

What is claimed is:

1. A non-volatile latch circuit comprising:
   a storage circuit; and
   a control circuit coupled to the storage circuit, the control circuit operable to program a logic value into the storage circuit using only a programming voltage/supply voltage signal, a data input signal, and a read/write signal, wherein the control circuit is operable to receive an equalize signal, wherein the equalize signal causes a difference in voltage between a first node of the storage circuit and a second node of the storage circuit to be reduced.

2. The non-volatile latch circuit of claim 1 wherein the programming voltage/supply voltage signal can be a programming voltage or a supply voltage.

3. The non-volatile latch circuit of claim 1 wherein the data input signal carries the logic value that will be programmed into the storage circuit.

4. The non-volatile latch circuit of claim 1 wherein the read/write signal controls whether the logic value is programmed into the storage circuit or whether the logic value is read out of the storage circuit.

5. The non-volatile latch circuit of claim 1 wherein the storage circuit includes a first floating gate NMOS transistor and a second floating gate NMOS transistor.

6. The non-volatile latch circuit of claim 1 wherein the control circuit includes a first transistor coupled to receive the programming voltage/supply voltage signal and a second transistor coupled to receive the programming voltage/supply voltage signal.

7. The non-volatile latch circuit of claim 1 wherein the non-volatile latch circuit is implemented in an integrated circuit device.

8. A non-volatile latch circuit comprising:
   a storage circuit; and
   a control circuit coupled to the storage circuit, the control circuit operable to program a logic value into the storage circuit using only a programming voltage/supply voltage signal, a data input signal, and a read/write signal, wherein the control circuit includes a first transistor coupled to receive the data input signal and an inverter coupled to receive the data input signal.

9. The non-volatile latch circuit of claim 8 wherein the programming voltage/supply voltage signal can be a programming voltage or a supply voltage.

10. The non-volatile latch circuit of claim 8 wherein the data input signal carries the logic value that will be programmed into the storage circuit.

11. The non-volatile latch circuit of claim 8 wherein the read/write signal controls whether the logic value is programmed into the storage circuit or whether the logic value is read out of the storage circuit.

12. The non-volatile latch circuit of claim 8 wherein the storage circuit includes a first floating gate NMOS transistor and a second floating gate NMOS transistor.

13. The non-volatile latch circuit of claim 8 wherein the control circuit includes a second transistor coupled to receive the programming voltage/supply voltage signal and a third transistor coupled to receive the programming voltage/supply voltage signal.

14. The non-volatile latch circuit of claim 8 wherein the non-volatile latch circuit is implemented in an integrated circuit device.

15. A non-volatile latch circuit comprising:
   a storage circuit; and
   a control circuit coupled to the storage circuit, the control circuit operable to program a logic value into the storage circuit using only a programming voltage/supply voltage signal, a data input signal, and a read/write signal, wherein the control circuit includes an inverter coupled to receive the read/write signal, a first transistor coupled to receive the read/write signal, and a second transistor coupled to receive the read/write signal.

16. The non-volatile latch circuit of claim 15 wherein the programming voltage/supply voltage signal can be a programming voltage or a supply voltage.

17. The non-volatile latch circuit of claim 15 wherein the data input signal carries the logic value that will be programmed into the storage circuit.

18. The non-volatile latch circuit of claim 15 wherein the read/write signal controls whether the logic value is programmed into the storage circuit or whether the logic value is read out of the storage circuit.

19. The non-volatile latch circuit of claim 15 wherein the storage circuit includes a first floating gate NMOS transistor and a second floating gate NMOS transistor.

20. The non-volatile latch circuit of claim 15 wherein the control circuit includes a third transistor coupled to receive the programming voltage/supply voltage signal and a fourth transistor coupled to receive the programming voltage/supply voltage signal.

21. The non-volatile latch circuit of claim 15 wherein the non-volatile latch circuit is implemented in an integrated circuit device.

22. A non-volatile latch circuit comprising:
    a storage circuit comprising a first floating gate transistor and a second floating gate transistor; and
    a control circuit comprising:
        a third transistor coupled to receive a programming voltage/supply voltage signal and a fourth transistor coupled to receive the programming voltage/supply voltage signal;
        a fifth transistor coupled to receive a data input signal and a first inverter coupled to receive the data input signal; and
        a second inverter coupled to receive a read/$\overline{\text{write}}$ signal, a sixth transistor coupled to receive the read/$\overline{\text{write}}$ signal, and a seventh transistor coupled to receive the read/$\overline{\text{write}}$ signal.

23. The non-volatile latch circuit of claim 22 wherein the control circuit further comprises an eighth transistor coupled to the first transistor and the second transistor, the eighth transistor coupled to receive an equalize signal.

24. The non-volatile latch circuit of claim 22 further comprising an eighth transistor coupled to the second inverter and a ninth transistor coupled to the second inverter.

25. The non-volatile latch circuit of claim 22 further comprising an eighth transistor coupled to the first transistor and the third transistor and a ninth transistor coupled to the second transistor and the fourth transistor, the eighth and ninth transistors coupled to receive a signal that causes a voltage drop across the first and second transistors to be less than a maximum voltage drop that the first and second transistors can withstand.

26. The non-volatile latch circuit of claim 22 wherein the first, second, fifth, sixth, and seventh transistors are NMOS transistors.

27. The non-volatile latch circuit of claim 22 wherein the third and fourth transistors are PMOS transistors.

28. The non-volatile latch circuit of claim 22 wherein the first inverter includes an NMOS transistor and a PMOS transistor and the second inverter includes an NMOS transistor and a PMOS transistor.

29. A method for programming a non-volatile latch circuit, the method comprising:
    increasing a programming voltage/supply voltage signal from a first voltage value to a second voltage value;
    maintaining the programming voltage/supply voltage signal at the second voltage value while maintaining a data input signal at a constant voltage value and while maintaining a read/$\overline{\text{write}}$ signal at a constant voltage value; and
    decreasing the programming voltage/supply voltage signal from the second voltage value to the first voltage value.

30. The method of claim 29 further comprising maintaining the data input signal at a constant voltage value while increasing, maintaining, and decreasing.

31. The method of claim 29 further comprising maintaining the read/$\overline{\text{write}}$ signal at a constant voltage value while increasing, maintaining, and decreasing.

32. The method of claim 29 wherein a logic value is programmed into the non-volatile latch circuit using only the programming voltage/supply voltage signal, the data input signal, and the read/$\overline{\text{write}}$ signal.

* * * * *